(12) United States Patent
Tang et al.

(10) Patent No.: US 11,315,942 B2
(45) Date of Patent: Apr. 26, 2022

(54) NONVOLATILE MEMORY DEVICE HAVING A MEMORY-TRANSISTOR GATE-ELECTRODE PROVIDED WITH A CHARGE-TRAPPING GATE-DIELECTRIC LAYER AND TWO SIDEWALL SELECT-TRANSISTOR GATE-ELECTRODES

(71) Applicant: Shanghai Huali Microelectronics Corporation, Shanghai (CN)

(72) Inventors: Xiaoliang Tang, Shanghai (CN); Guanglong Chen, Shanghai (CN); Naoki Tsuji, Shanghai (CN); Hua Shao, Shanghai (CN)

(73) Assignee: Shanghai Huali Integrated Circuit Mfg. Co. Ltd., Shanghai (CN)

( * ) Notice: Subject to any disclaimer, the term of this patent is extended or adjusted under 35 U.S.C. 154(b) by 179 days.

(21) Appl. No.: 16/666,418

(22) Filed: Oct. 29, 2019

(65) Prior Publication Data

US 2020/0176463 A1 Jun. 4, 2020

(51) Int. Cl.
*H01L 27/11568* (2017.01)
*H01L 21/28* (2006.01)
(Continued)

(52) U.S. Cl.
CPC .... *H01L 27/11568* (2013.01); *G11C 16/0466* (2013.01); *H01L 21/02532* (2013.01); *H01L 21/26513* (2013.01); *H01L 21/2815* (2013.01); *H01L 21/7624* (2013.01); *H01L 27/0207* (2013.01); *H01L 27/1157* (2013.01);
(Continued)

(58) Field of Classification Search
CPC ............. H01L 27/1157; H01L 27/1203; H01L 29/40117; H01L 29/42344; H01L 29/511; H01L 29/512; H01L 29/513; H01L 29/518; H01L 29/66484; H01L 29/6656; H01L 29/66833; H01L 29/7831; H01L 29/792; H01L 21/2815; H01L 21/7624; H01L 21/84; G11C 16/0466
See application file for complete search history.

(56) References Cited

U.S. PATENT DOCUMENTS

5,408,115 A * 4/1995 Chang .................... H01L 27/115
257/314
5,838,041 A * 11/1998 Sakagami ......... H01L 29/40117
257/324
(Continued)

*Primary Examiner* — Marcos D. Pizarro
(74) *Attorney, Agent, or Firm* — Adsero IP (57) ABSTRACT

The present disclosure provides a SONOS memory structure and a manufacturing method therefor. The SONOS memory structure including a substrate and a select transistor gate and a memory transistor gate formed on the substrate, wherein the substrate is a composite substrate including a base silicon layer, a buried oxide layer and a surface silicon layer, wherein the upper portion of the base silicon layer has a memory transistor well region formed therein; the select transistor gate and the memory transistor gate are formed on the surface silicon layer; the select transistor gate comprises a first select transistor gate and a second select transistor gate, the first select transistor gate and the second select transistor gate are respectively located at two sides of the memory transistor gate, and are electrically isolated from the memory transistor gate by first spacers on both sides of the memory transistor gate.

7 Claims, 8 Drawing Sheets

(51) Int. Cl.
  *H01L 21/02*    (2006.01)
  *H01L 21/265*   (2006.01)
  *H01L 21/762*   (2006.01)
  *H01L 27/02*    (2006.01)
  *H01L 27/12*    (2006.01)
  *H01L 29/423*   (2006.01)
  *H01L 29/51*    (2006.01)
  *H01L 29/66*    (2006.01)
  *H01L 29/792*   (2006.01)
  *H01L 27/1157*  (2017.01)
  *H01L 29/78*    (2006.01)
  *G11C 16/04*    (2006.01)

(52) U.S. Cl.
  CPC .... *H01L 27/1203* (2013.01); *H01L 29/40117* (2019.08); *H01L 29/42344* (2013.01); *H01L 29/511* (2013.01); *H01L 29/512* (2013.01); *H01L 29/513* (2013.01); *H01L 29/518* (2013.01); *H01L 29/6653* (2013.01); *H01L 29/6656* (2013.01); *H01L 29/66484* (2013.01); *H01L 29/66833* (2013.01); *H01L 29/7831* (2013.01); *H01L 29/792* (2013.01)

(56) References Cited

U.S. PATENT DOCUMENTS

2003/0194841 A1* 10/2003 Inoue ............... H01L 27/11568
                                                        438/257
2010/0163966 A1*  7/2010 Kwon ............... H01L 27/11568
                                                        257/324

* cited by examiner

NONVOLATILE MEMORY DEVICE HAVING A MEMORY-TRANSISTOR GATE-ELECTRODE PROVIDED WITH A CHARGE-TRAPPING GATE-DIELECTRIC LAYER AND TWO SIDEWALL SELECT-TRANSISTOR GATE-ELECTRODES

CROSS-REFERENCES TO RELATED APPLICATIONS

The present application claims priority to Chinese Patent Application No. 201811444528.2, filed on Nov. 29, 2018, entitled "A SONOS MEMORY STRUCTURE AND MANUFACTURING METHOD", which is incorporated by reference herein for all purposes.

FIELD

The present disclosure relates to the field of semiconductor devices and manufacturing method therefor, and in particular to a SONOS memory structure and a manufacturing method therefor.

BACKGROUND

Since the disclosure of integrated circuits by Dr. Jack Kilby of Texas Instruments in early years, scientists and engineers have made numerous disclosures and improvements in semiconductor devices and processes. Over 50 years, the dimension of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 20 nm, and some companies are embarking on 14 nm processes. Just to provide a reference herein, a silicon atom is about 0.2 nm, which means that the distance between two separate components manufactured by a 20 nm process is about only one hundred silicon atoms.

Currently in integrated circuits, in particular to the SONOS technology of the conventional bulk silicon process, one memory cell includes two independent transistor structures, which are a memory transistor and a select transistor matching with the memory transistor, and the memory transistor has an SONOS (Silicon (gate)-Oxide-Nitride-Oxide-Silicon (substrate)) structure which is used to store charge and achieve data storage through different Vt states. The select transistor portion is a conventional MOS transistor for turning on and off the memory transistor.

As mentioned above, semiconductor device manufacturing has become increasingly challenging and advancing toward the physically possible limit. With the continuous reduction in the size of super-large-scale integrated circuits, the limitations on processes and materials properties are increasingly significant, such that it is increasingly difficult to reduce the size of planar transistors. Compared with a planar transistor manufactured by a conventional bulk silicon process, a fully depleted silicon-on-insulator (FDSOI) device is considered to be a kind of novel potential planar device due to low consumption and also the characteristics of being able to simplify production processes. Fully depleted silicon-on-insulator has an ultra-thin insulation layer, namely a buried oxide layer. The buried oxide layer can effectively limit the electrons flowing from a source to a drain, so as to greatly reduce leakage currents flowing from a channel to a substrate; moreover, by means of applying body bias, an FDSOI transistor can rapidly run under a low voltage, so as to substantially improve energy efficiency.

At present, the SONOS memory with SOI technology is only equipped with the SOI technology in the logic region of the SONOS memory, and the memory cell portion of the SONOS memory is the same structure as the conventional bulk silicon process. The relevant SONOS process needs to be performed by etching the same substrate region as the bulk silicon process on the SOI silicon wafer.

Based on this, there is an urgent need for a manufacturing method of SONOS, which can combine the above SOI process and SONOS process, and make the manufactured SONOS memory cell occupies a smaller wafer surface area in a simple process. At the same time, the SONOS device is placed on the SOI for operation, so that the SONOS memory has better leakage characteristics and uniformity.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

The present disclosure provides a SONOS memory structure, including a substrate and a select transistor gate and a memory transistor gate formed on the substrate, wherein the substrate is a composite substrate including a base silicon layer, a buried oxide layer and a surface silicon layer in order from bottom to top, wherein the upper portion of the base silicon layer has a memory transistor well region formed therein; the select transistor gate and the memory transistor gate are formed on the surface silicon layer; the select transistor gate comprises a first select transistor gate and a second select transistor gate, the first select transistor gate and the second select transistor gate are respectively located at two sides of the memory transistor gate, and are electrically isolated from the memory transistor gate by first spacers on both sides of the memory transistor gate; and silicon epitaxial layers adjacent to the first select transistor gate and the second select transistor gate are respectively formed on the upper surface of the surface silicon layer outside the first select transistor gate and the second select transistor gate.

In one embodiment, the first select transistor gate and the second select transistor gate are symmetric about the memory transistor gate.

In one embodiment, an ONO memory layer is disposed between the memory transistor gate and the surface silicon layer, a gate oxide layer is disposed between the first select transistor gate, the second select transistor gate and the surface silicon layer.

In one embodiment, the silicon epitaxial layer has a height higher than a height of the gate oxide layer.

In one embodiment, each of the first spacers further comprises an extension extending to the upper surface of the surface silicon layer, the extension being adjacent to each of the silicon epitaxial layers, the first select transistor gate and the second select transistor gate are formed over the extension, and the gate oxide layer is the extension.

In one embodiment, the gate oxide layer is an oxide layer formed on the upper surface of the surface silicon layer after the extension is removed.

In one embodiment, the upper portion of the base silicon layer has a deep well region, and the memory transistor well region is located at the upper portion of the deep well region; and the memory transistor well region and the base silicon layer are both of a first doping type, and the deep well region is of a second doping type different from the first doping type, wherein the first doping type is P-type, and the second doping type is N-type; or the first doping type is N-type, and the second doping type is P-type.

The present disclosure further provides a manufacturing method for a SONOS memory structure, comprising:

providing a substrate, the substrate being a composite substrate including a base silicon layer, a buried oxide layer and a surface silicon layer in order from bottom to top, wherein a memory transistor well region is formed in the upper portion of the base silicon layer; forming a memory transistor gate on the surface silicon layer, and forming first spacers on both side surfaces of the memory transistor gate; epitaxial growing silicon epitaxial layers on the surface silicon layer on both sides of the memory transistor gate, and forming a first select transistor gate and a second select transistor gate, wherein the first select transistor gate and the second select transistor gate are respectively located at two sides of the memory transistor gate, and are electrically isolated from the memory transistor gate by the first spacers, and the silicon epitaxial layers are adjacent to the first select transistor gate and the second select transistor gate.

In one embodiment, before the step of forming the memory transistor gate, further comprising forming an ONO memory layer on the upper surface of the surface silicon layer; and the memory transistor gate is formed on the upper surface of the ONO memory layer, the first spacers are formed on both sides of the memory transistor gate and the ONO memory layer.

In one embodiment, further comprising: after the first spacers being formed, forming second spacers on the side surfaces of the first spacers, wherein the second spacers on both sides of the memory transistor gate are symmetric about the memory transistor gate; the step of epitaxial growing the silicon epitaxial layer, forming the first select transistor gate and the second select transistor gate further comprises: epitaxial growing the silicon epitaxial layer on the surface silicon layer adjacent to the second spacers; and removing the second spacers and forming the first select transistor gate and the second select transistor gate in a region corresponding to the second spacers.

In one embodiment, the forming the first spacers and the second spacers further comprises: forming a first spacer layer covering the memory transistor gate and the surface silicon layer; forming a second spacer layer covering the surface of the first spacer layer; etching the first spacer layer and the second spacer layer, leaving the first spacer layer and the second spacer layer on both sides of the memory transistor gate to form the first spacers and the second spacers, wherein each of the first spacers includes an extension on a surface of the surface silicon layer; forming the first select transistor gate and the second select transistor gate further includes: after removing the second spacers, forming the first select transistor gate and the second select transistor gate on an upper surface of the extension.

In one embodiment, the height of the epitaxial layer being formed is higher than the height of the extension.

In one embodiment, forming the first select transistor gate and the second select transistor gate further comprises: after removing the second spacers, removing the extension; growing an oxide layer in a region corresponding to the extension, and forming the first select transistor gate and the second select transistor gate on an upper surface of the oxide layer.

In one embodiment, the base silicon layer is of a first doping type, the memory transistor well region is formed by ion implantation of the first doping type; a deep well region is formed by ion implantation of a second doping type at the upper portion of the base silicon layer, the memory transistor well region is formed at an upper portion of the deep well region, wherein the first doping type is P-type, the second doping type is N-type; or the first doping type is N-type, and the second doping type is P-type.

According to the manufacturing method of the SONOS memory structure provided by the present disclosure, the manufacturing process is simple and easy to develop, and the silicon epitaxial growth structure in the SOI process can be combined to form a more compact SONOS memory cell. The SONOS memory cell provided by the disclosure has a compact structure and greatly reduces the surface area of the semiconductor wafer occupied by the SONOS. Moreover, the uniformity between the provided SONOS storage units is better, and the leakage performance is better.

REFERENCE SIGNS

101 N-type semiconductor substrate
102 P-type well of select transistor
103 P-type well of memory transistor
104 oxide layer
105 select transistor gate
106 ONO layer
107 memory transistor gate
110 first spacer
120 second spacer
210 logic well
220 buried oxide layer
230 surface silicon layer
231 epitaxial silicon layer
240 transistor
300, 500, 600 base silicon layer
301, 501, 601 deep well region
310, 510, 610 memory transistor well
320, 520, 620 buried oxide layer
330, 530, 630 surface silicon layer
331, 531, 631 epitaxial silicon layer 340, 540, 640 memory transistor gate
342, 542, 642 ONO memory layer
550, 650 second spacer
351, 551, 651 first select transistor gate
352, 552, 652 second select transistor gate
360, 560, 660 first spacer
370, 670 gate oxide layer
561, 661 extension
556, 656 recess
558, 658 Polycrystalline silicon
671 oxide layer

DETAILED DESCRIPTION

The present disclosure is described below in detail in conjunction with the accompanying drawings and particular embodiments. It is noted that the aspects described in conjunction with the accompanying drawings and particular embodiments are merely exemplary, and should not be construed as any limitation on the scope of protection of the present disclosure.

The present disclosure relates to a semiconductor process and device. Embodiments of the present disclosure provide a semiconductor device. The semiconductor device is a SONOS memory cell formed on the surface of the SOI, each SONOS memory cell includes a memory transistor gate, a first select transistor gate and a second select transistor gate, the first select transistor gate and the second select transistor gate are located at two sides of the memory transistor gate. The first select transistor gate and second select transistor gate are respectively electrically isolated from the memory transistor gate by spacers. Silicon epitaxial layers are epitaxially grown at the outer sides of the first select transistor gate and the second select transistor gate. The above SONOS memory structure is compact, therefore reducing the size of the transistor. The present disclosure also provides other embodiments.

Various modifications, as well as various uses in various applications and the generic principles defined herein may be applied to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. However, the present disclosure may not necessarily be limited to these specific details. In other words, well-known structures and devices are shown in the block diagram form and are not shown in detail to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by alternative features serving the same, equivalent, or similar purpose. Therefore, unless expressly stated otherwise, each feature disclosed is only one example of a group of equivalent or similar features.

Note that when used, the flags left, right, front, back, top, bottom, front, back, clockwise, and counterclockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 1:
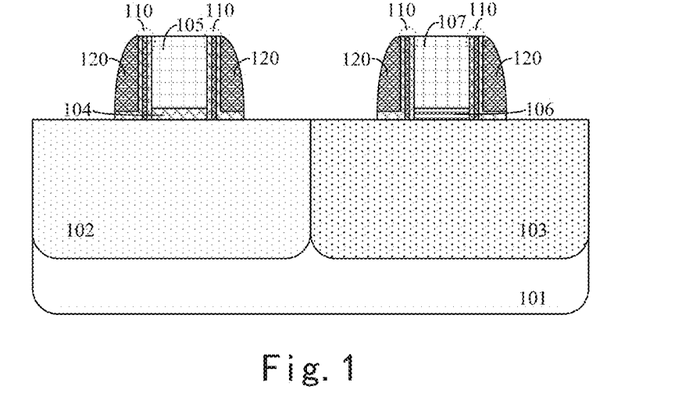
FIG. 1 shows a structural schematic diagram of a SONOS memory cell manufactured by a bulk silicon process in the prior art.

Please refer to FIG. 1. FIG. 1 is a schematic diagram showing the structure of a SONOS memory cell fabricated by using a bulk silicon process in the prior art. Conventional SONOS memory cells are typically constructed of conventional nMOS transistors (select transistors) formed on a P-type well and SONOS memory transistors formed on a memory well. The select transistor is a conventional MOS transistor for turning on and off the storage transistor. The memory transistor has a SONOS (Silicon(gate)-Oxide-Nitride-Oxide-Silicon (substrate)) structure for storing charges and implementing data storage through different Vt states. In one embodiment, as shown in FIG. 1, the SONOS memory cell includes an N-type semiconductor substrate 101; a select transistor P-type well 102; a memory transistor P-type well 103; and a select transistor gate 105 that is isolated from the select transistor well 102 by an oxide layer 104; the memory transistor gate 107 that is isolated from the memory transistor well 103 by a ONO layer 106. The first spacers 110 and the second spacers 120 are located at both sides of the select transistor gate 105 and both sides of the memory transistor gate 107. In one embodiment, the first spacer includes an ONO structure. Generally, the thickness of the first spacer 110 determines the distance from the gate to the source/drain extension region, and the thickness of the second spacer 120 determines the distance from the gate to the source/drain.

It can be seen from FIG. 1 that the select transistor gate 105 and the memory transistor gate 107 of the SONOS memory cell structure manufactured by the bulk silicon process in the prior art are far apart, which is disadvantageous for reducing the critical dimensions of the transistor. At the same time, the reduction in critical dimensions leads to a reduction in the electrical performance of the transistor device that is also needed to be considered and solved in the industry.

Currently, fully depleted silicon-on-insulator (FDSOI) devices fabricated using Silicon-on-Insulator (SOI) technology is considered to be a kind of novel potential planar device due to low consumption and also the characteristics of being able to simplify production processes. Fully depleted silicon-on-insulator has an ultra-thin insulation layer, namely a buried oxide layer. The buried oxide layer can effectively limit the electrons flowing from a source to a drain, so as to greatly reduce leakage currents flowing from a channel to a substrate; moreover, by means of applying body bias, an FDSOI transistor can rapidly run under a low voltage, so as to substantially improve energy efficiency.

Applying the SOI process to the SONOS memory enables the SONOS memory to have superior leakage characteristics and uniformity. However, the existing SONOS memory with SOI technology is only equipped with SOI technology in the logic area of SONOS memory. The memory cell part of SONOS memory is the same structure as fabricated by the traditional bulk silicon process, and the relevant SONOS process needs to be performed on the same substrate region etched on the SOI wafer as formed by the traditional bulk silicon process.

Figure 2:
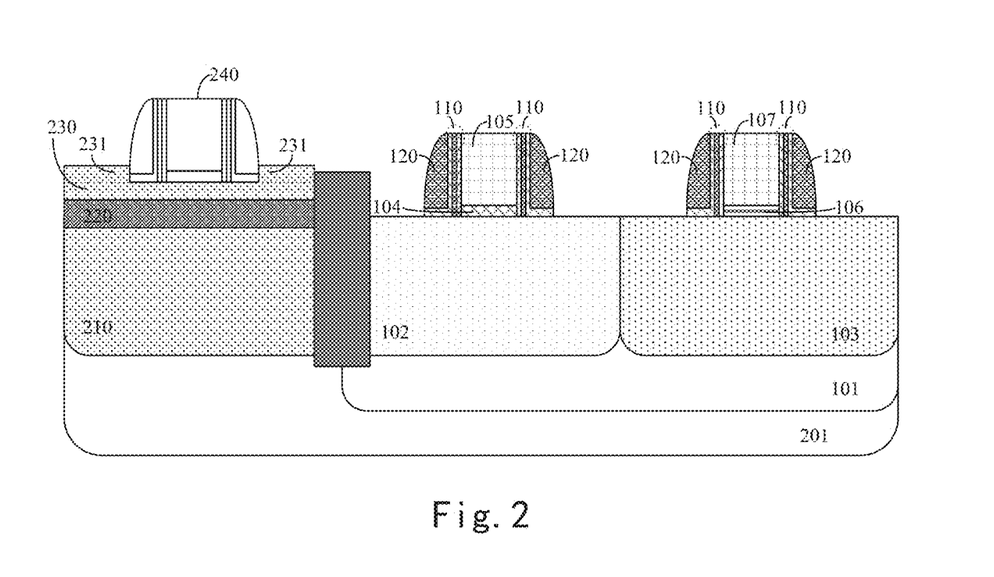
FIG. 2 shows a structural schematic diagram of SONOS memory manufactured by the prior art using the FDSOI process.

FIG. 2 shows a structural schematic diagram of SONOS memory manufactured by the prior art using the FDSOI process. A SONOS memory cell region and a logic region of a SONOS memory separated by an isolation medium are formed in the substrate 201, and the SONOS memory cell region is identical in structure to the existing bulk silicon process. Please refer to the previous description and will not repeat them here. The logic region fabricated by an SOI process includes a composite substrate composed of a silicon substrate layer (the upper portion of which is a logic well 210), a buried oxide layer 220, and a surface silicon layer 230, and a transistor 240 of the logic region formed above the surface silicon layer 230. Epitaxially grown epitaxial silicon layer 231 are formed on both sides of the transistor 240 of the logic region. A similar conventional sigma shape can be formed on surface the silicon layer 230 by the epitaxial silicon layer 231 to improve stress and improve electrical performance of the device.

However, as can be seen from FIG. 2, the prior art only applies the SOI process to the logic region, and the spacing between the select transistor gate 105 and the memory transistor gate 107 in the storage region is still too large to be able to reduce the critical dimensions of the device. At the same time, the memory cell unit still adopts the traditional bulk silicon process, which is incompatible with the SOI process, and the manufacturing process is complicated.

Figure 3:
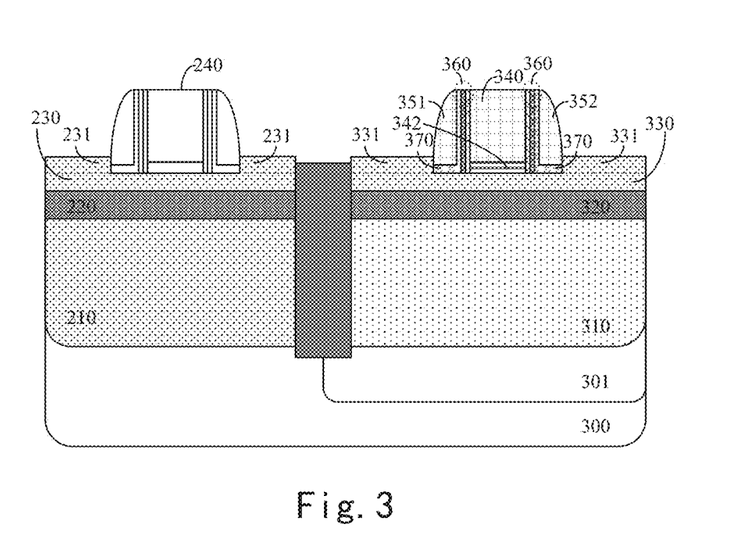
FIG. 3 shows a structural schematic diagram of SONOS memory manufactured by the manufacturing method provided by the present disclosure.
Figure 4:
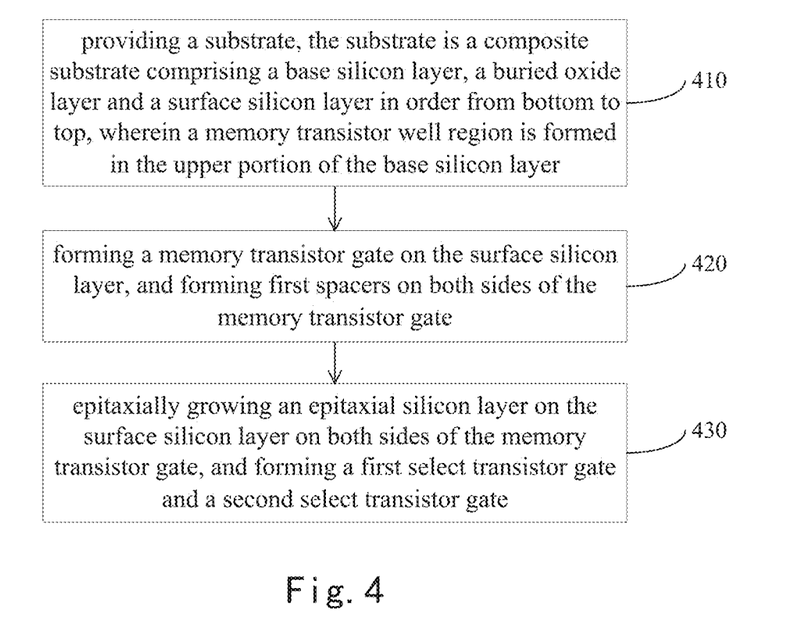
FIG. 4 shows a flow chart of the manufacturing method provided by the present disclosure.

With above in mind, the present disclosure provides a method for manufacturing a SONOS memory cell. Please refer to FIG. 3 and FIG. 4. FIG. 3 shows a structural schematic diagram of SONOS memory manufactured by the manufacturing method provided by the present disclosure. FIG. 4 shows a flow chart of the manufacturing method provided by the present disclosure.

Referring to FIG. 3, the SONOS memory cell provided by the present disclosure is located in a memory area in a substrate. A logic area of a SONOS memory separated by an isolation medium is formed in the substrate. The structure of the logic area is as described above, and will not be described herein.

The SONOS memory cell provided by the present disclosure comprises a substrate and a select transistor gate and a memory transistor gate formed on the substrate, wherein the substrate is a composite substrate, and the composite substrate has a base silicon layer 300, a buried oxide layer 320 and a surface silicon layer 330 in order from bottom to top. The upper portion of the base silicon layer is a memory transistor well region 310, and the memory transistor well region 310 is formed in a deep well region 301. The above-described memory transistor well region 310 provides a possibility for the SONOS memory unit to implement a data storage function.

The memory transistor well region 310 and the base silicon layer 300 are both of a first doping type. The deep well region 301 is of a second doping type different from the first doping type. In one embodiment, the first doping type is a P type, the second doping type is an N type; or the first doping type is an N type, and the second doping type is a P type.

A memory transistor gate 340 is formed on the surface silicon layer 330, and an ONO memory layer 342 is formed between the memory transistor gate 340 and the surface silicon layer 330. The ONO memory layer 342 described above implements data storage in response to the Vt state of the memory transistor gate 340.

First spacers 360 are formed on each side of the memory transistor gate 340. The first spacers 360 may protect the memory transistor gate 340 in a number of previous semiconductor processes (not covered by the present disclosure). At the same time, the thickness of the first spacers 360 determines the distance from the gate to the ion injection in a source-drain extension region.

In one embodiment, the first spacers 360 may be any existing or future material used as a side wall as needed. In an embodiment, the first spacers 360 may be an ONO material. It should be noted that the ONO material may be an ONO material different from the ONO memory layer 342.

A first select transistor gate 351 and a second select transistor gate 352 are formed on both sides of the first sidewall spacer 360. The first select transistor gate 351 and the second select transistor gate 352 are respectively electrically isolated from the memory transistor gate 340 by the first spacer 360. In an embodiment, the select transistor first gate 351 and the select transistor second gate 352 are symmetric about the memory transistor gate 340. As can be seen from FIG. 3, the structure of the SONOS memory cell provided by the present disclosure is very compact, effectively reducing the surface area of the semiconductor wafer occupied by the SONOS memory cell.

Gate oxide layers 370 are respectively formed between the select transistor first gate 351 and the silicon surface layer 330 described above, and between the select transistor second gate 352 and the silicon surface layer 330 described above. Further, in a case where the first spacers 360 are an ONO material, the gate oxide layer 370 may be an extension of the first spacers 360 extending onto the surface silicon layer 330. In one embodiment, the above-described gate oxide layer 370 may also be formed by other forms, and is not limited to the extension of the first spacer 360.

An epitaxial silicon layer 331 adjacent to the first select transistor gate 351 and the second select transistor gate 352 is formed on the upper surface of the surface silicon layer 330 on the outside of the first select transistor gate 351 and the second select transistor gate 352. The epitaxial silicon layer 331 is also adjacent to the gate oxide layer 370. The epitaxial silicon layer described above can form a conventional sigma shape on the surface silicon layer 330 to improve stress and improve electrical performance of the device. The epitaxial silicon layer 331 has a height at least higher than the gate oxide layer 370.

The SONOS memory cell shown in FIG. 3 is manufactured by the manufacturing method shown in FIG. 4. In one embodiment, the manufacturing method provided by the present disclosure comprises:

Step 410: providing a substrate, the substrate is a composite substrate comprising a base silicon layer, a buried oxide layer and a surface silicon layer in order from bottom to top, wherein a memory transistor well region is formed in the upper portion of the base silicon layer;

Step 420: forming a memory transistor gate on the surface silicon layer, and forming first spacers on both sides of the memory transistor gate; and Step 430: epitaxially growing an epitaxial silicon layer on the surface silicon layer on both sides of the memory transistor gate, and forming a first select transistor gate and a second select transistor gate.

The first select transistor gate and the second select transistor gate are respectively located at two sides of the memory transistor gate, and are electrically isolated from the memory transistor gate by the first spacers, and the epitaxial silicon layer being adjacent to the first select transistor gate and the second select transistor gate.

Please refer to FIGS. 5A-5E and FIGS. 6A-6G for further reference. FIGS. 5A-5E and 6A-6G are schematic views respectively showing the structure of a SONOS memory cell in a manufacturing process of different embodiments of the manufacturing method provided by the present disclosure.

These diagrams provide examples only and should not unduly limit the scope of the claims. Depending on implementations, one or more steps may be added, removed, repeated, rearranged, modified, replaced, and/or alternated without affecting the scope of the claims.

Figure 5A:
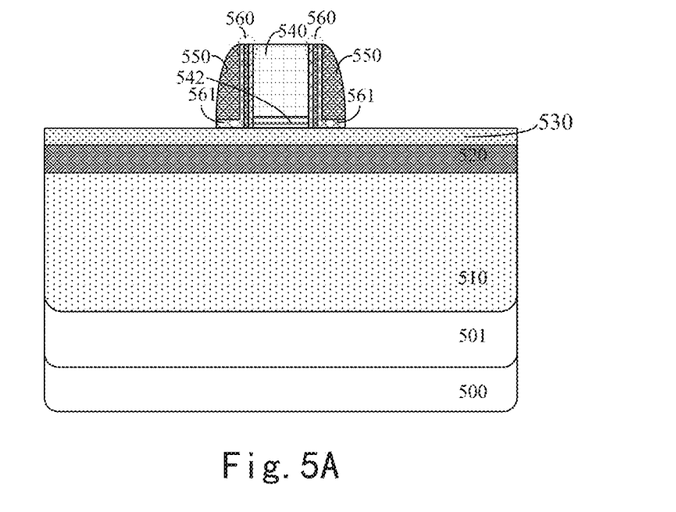
FIG. 5A-5E show a structural schematic diagram of a SONOS memory cell in a manufacturing process according to an embodiment of the manufacturing method provided by the present disclosure.

Referring first to FIGS. 5A-5E, as shown in FIG. 5A, a memory transistor gate 540 of a SONOS memory cell is formed on a substrate. In one embodiment, the substrate provided in the present disclosure is a composite substrate comprising a base silicon layer 500, a deep well region 501, a memory transistor well region 510 located at an upper portion of the deep well region 501, a buried oxide layer 520 and a surface silicon layer 530, so as to form a fully depleted silicon-on-insulator (FDSOI). The FDSOI has an ultra-thin insulation layer, namely the buried oxide layer 520. The buried oxide layer 520 can effectively limit the electrons flowing from a source to a drain, so as to greatly reduce leakage currents flowing from a channel to a substrate; moreover, by means of applying body bias, an FDSOI transistor can rapidly run under a low voltage, so as to substantially improve energy efficiency.

In one embodiment, the base silicon layer 500 is N-type doped, the deep well region 501 is a P-type well, the memory transistor well region 510 is an N-type well, and the surface silicon layer 530 is N-type doped. In one embodiment, the base silicon layer 500 may also be P-type doped, the deep well region 501 may also be an N-type well, the memory transistor well region 510 may also be a P-type well, and the surface silicon layer 530 may also be P-type doped, which is specifically adjusted to the actual type of device required. The formation of each well includes at least three to five steps to complete the fabrication, including, but not limited to, epitaxial growth, native oxide growth, ion implantation using a mask, further high-energy ion implantation and annealing.

In an embodiment, as shown in FIG. 5A, the formed memory transistor gate 540 is located above the surface silicon layer 530, and the ONO memory layer 542 is disposed between the memory transistor gate 540 and the surface silicon layer 530. The first spacers 560 are formed on both sides of the memory transistor gate 540 and the ONO memory layer 542. Further, the first spacers 560 may be an ONO material and have an extension portion 561 extending to the surface silicon layer 530. In one embodiment, the above-mentioned examples of the material and form of the first spacers 560 are not limited thereto. Further, the surface of the first spacer 560 has a second spacer 550 formed thereon.

In one embodiment, the second spacer 550 may be made of silicon nitride, and the thickness of the first spacer determines the distance from the gate to the ion injection in a source-drain extension region, and the thickness of second spacer defines the distance from the gate to the source/drain. In one embodiment, the above-mentioned memory transistor gate formed with the first spacer and the second spacer may be formed by any existing or future gate forming process.

The second spacer and the first spacer may be symmetrically formed on both side surfaces of the gate, and generally the second spacer described above will remain as a part of the device in the final product of the semiconductor device. In the present disclosure, the second spacer will be removed in a subsequent process, and a select transistor of the SONOS memory cell will be formed at the corresponding position to further reduce the size of the SONOS memory cell.

Figure 5B:
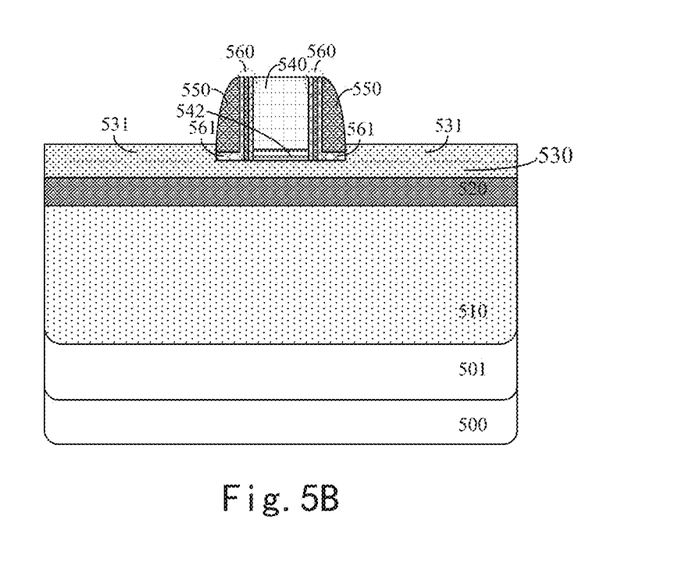

Referring to FIG. 5B, in FIG. 5B, an epitaxial silicon layer 531 epitaxially grown on the upper surface of the surface silicon layer 530 has been formed. The epitaxial silicon layer 531 is formed on both side edges of the second spacers 550, and is adjacent to the second spacers and the extensions 561 of the first spacers. The epitaxial silicon layer 531 can form a similar sigma shape on the surface silicon layer 530 to improve stress and improve electrical performance of the device. And the height of the silicon epitaxial layer 531 is higher than the height of the extension portion 561.

Figure 5C:
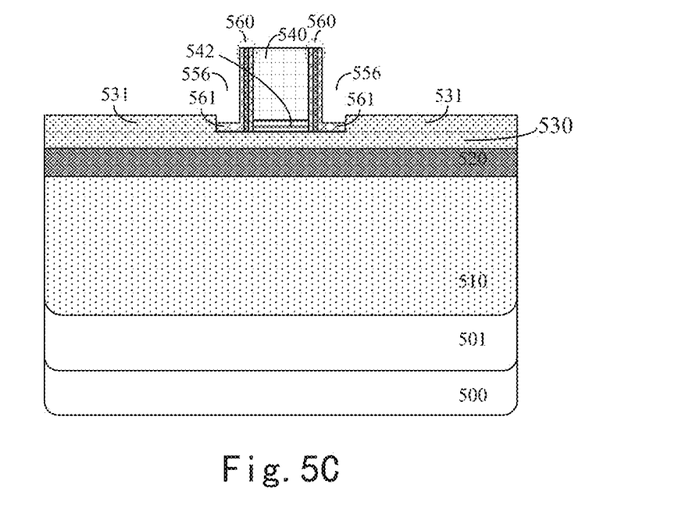

Referring to FIG. 5C, in FIG. 5C, the second spacers have been removed to form recesses 556 in regions originally corresponding to the second spacers. Since the height of the generated epitaxial silicon layer 531 is higher than the height of the extension portion 561, after the second spacers being removed, the regions corresponding to the second spacers can form the recesses 556. The recesses 556 remain the topography of the second spacers and can be symmetrically formed on both sides of the gate. After the above-described recesses 556 being formed, the select transistor gates of the SONOS memory cell can be formed in the recesses 556 in the subsequent process, and the size of the select transistor gates is directly defined.

In one embodiment, the second spacers may be removed using dry etching, wet etching, and/or other etching methods (e.g., reactive ion etching). In an embodiment, the second spacers are removed by pickling. Further, the second spacer of the SiN material may be removed by using phosphoric acid.

Figure 5D:
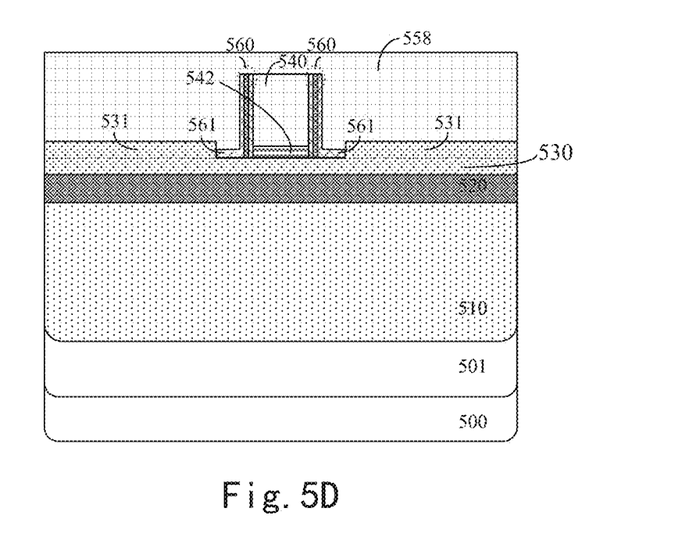

Refer to FIG. 5D. In FIG. 5D, polycrystalline silicon 558 is deposited to form the select transistor gates. The above deposition process includes, but is not limited to, depositing the polycrystalline silicon 558 to form the select transistor gates by chemical vapor deposition (CVD), physical vapour deposition (PVD), atomic layer deposition (ALD), high density plasma CVD (HDPCVD), metal organic CVD (MOCVD), or plasma enhanced CVD (PECVD). The polycrystalline silicon 558 covers the epitaxial silicon layer 531, the first spacer 560 and its extension 561 and the memory transistor gate 540.

Figure 5E:
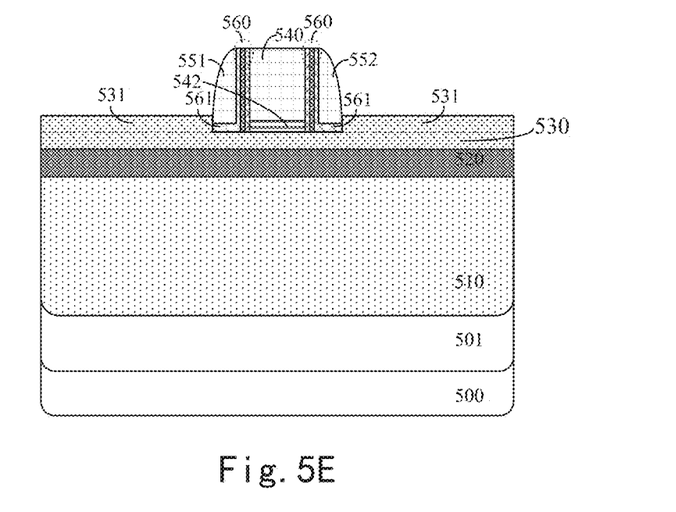

Subsequently, referring to FIG. 5E, the polycrystalline silicon 558 is etched to form a first select transistor gate 551 and a second select transistor gate 552. The etching process may include dry etching, wet etching and/or other etching manner (e.g., reactive ion etching). The etching process may also be purely chemical (plasma etching), purely physical (ion milling), and/or a combination of the foregoing. In an embodiment, the etching of the polycrystalline silicon 558 is performed by a dry etching process, and since the recesses have been formed by the epitaxial silicon layer in the pre-process, the recesses define the select transistor gates and gate dimensions therefore. With a dry etch process, the first select transistor gate and the second select transistor gate can be etched at a time. The first select transistor gate and the second select transistor gate remain the topography of the second spacers because of the recesses and can be symmetrically formed on both sides of the memory transistor gate. The process provided by the disclosure is simple, and at the same time, the effect of reducing the area of the memory cell can be achieved.

The embodiment of the manufacturing method provided by the present disclosure has been described to produce the SONOS structure. By modifying the existing SOI process, after silicon epitaxial growth, the silicon nitride of the second spacers can be removed by pickling, and then the polycrystalline silicon deposition and etching for the select transistor gates can be performed, and the height of the silicon epitaxial growth of the source/drain can be utilized to generate a new SONOS structure. And the definition of the channel length of the select transistor gates does not require the development of a special dry etching process. Without need for adding the mask, the process development is simple, and the area of the SONOS memory unit is reduced.

The present disclosure also provides another embodiment of the method of fabricating a SONOS memory cell. Please refer to FIGS. 6A-6G.

Figure 6A:
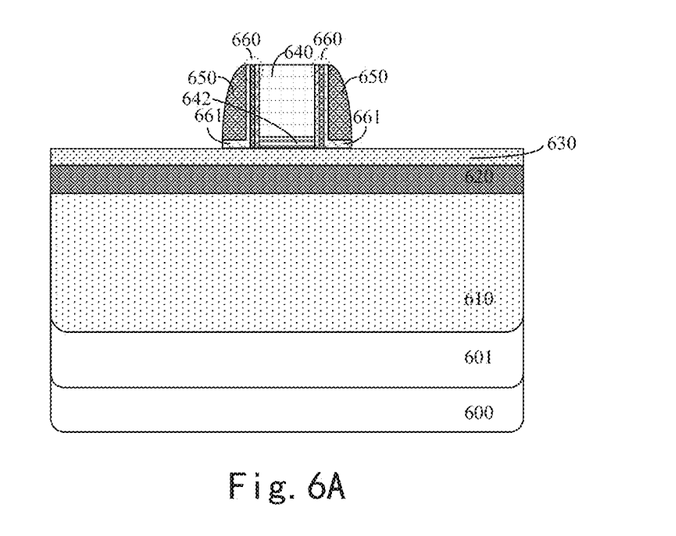
FIG. 6A-6G show a structural schematic diagram of a SONOS memory cell in a manufacturing process in accordance with another embodiment of the manufacturing method provided by the present disclosure.

Firstly, as shown in FIG. 6A, a memory transistor gate 540 of a SONOS memory cell is formed on a substrate. In one embodiment, the substrate provided in the present disclosure is a composite substrate comprising a base silicon layer 600, a deep well region 601, a memory transistor well region 610 located at an upper portion of the deep well region 601, a buried oxide layer 620 and a surface silicon layer 630, so as to form a fully depleted silicon-on-insulator (FDSOI). The FDSOI has an ultra-thin insulation layer, namely the buried oxide layer 620. The buried oxide layer 620 can effectively limit the electrons flowing from a source to a drain, so as to greatly reduce leakage currents flowing from a channel to a substrate; moreover, by means of applying body bias, an FDSOI transistor can rapidly run under a low voltage, so as to substantially improve energy efficiency.

In one embodiment, the base silicon layer 600 is N-type doped, the deep well region 601 is a P-type well, the memory transistor well region 610 is an N-type well, and the surface silicon layer 630 is N-type doped. In one embodiment, the base silicon layer 600 may also be P-type doped, the deep well region 601 may also be an N-type well, the memory transistor well region 610 may also be a P-type well, and the surface silicon layer 630 may also be P-type doped, which is specifically adjusted to the actual type of device required. The formation of each well includes at least three to five steps to complete the fabrication, including, but not limited to, epitaxial growth, native oxide growth, ion implantation using a mask, and further high-energy ion implantation and annealing.

In an embodiment, as shown in FIG. 6A, the formed memory transistor gate 640 is located above the surface silicon layer 630, and the ONO memory layer 642 is disposed between the memory transistor gate 640 and the surface silicon layer 630. The first spacers 660 are formed on both sides of the memory transistor gate 640 and the ONO memory layer 642. Further, the first spacers 660 may be an ONO material and have an extension portion 661 extending to the surface silicon layer 630. In one embodiment, the above-mentioned examples of the material and form of the first spacers 660 are not limited thereto. Further, the surface of the first spacer 660 has a second spacer 650 formed thereon.

In one embodiment, the second spacer 650 may be made of silicon nitride, and the thickness of the first spacer determines the distance from the gate to the ion injection in a source-drain extension region, and the thickness of second spacer defines the distance from the gate to the source/drain. In one embodiment, the above-mentioned memory transistor gate formed with the first spacer and the second spacer may be formed by any existing or future gate forming process. The second spacer and the first spacer may be symmetrically formed on both side surfaces of the gate, and generally the second spacer described above will remain as a part of the device in the final product of the semiconductor device. In the present disclosure, the second spacer will be removed in a subsequent process, and a select transistor of the SONOS memory cell will be formed at the corresponding position to further reduce the size of the SONOS memory cell.

Figure 6B:
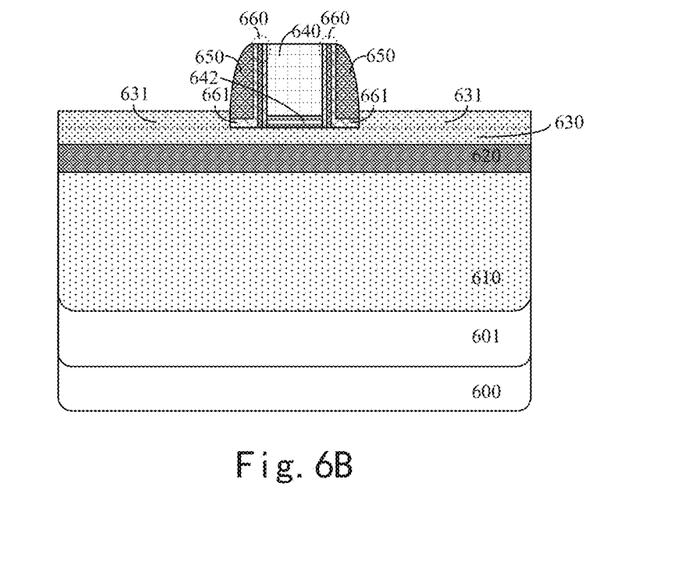

Referring to FIG. 6B, in FIG. 6B, an epitaxial silicon layer 631 epitaxially grown on the upper surface of the surface silicon layer 630 has been formed. The epitaxial silicon layers 631 is formed on both side edges of the second spacers 650, and is adjacent to the second spacers and the extensions 661 of the first spacers. The epitaxial silicon layer 631 can form a similar sigma shape on the surface silicon layer 630 to improve stress and improve electrical performance of the device. And the height of the silicon epitaxial layer 631 is higher than the height of the extension portion 661.

Figure 6C:
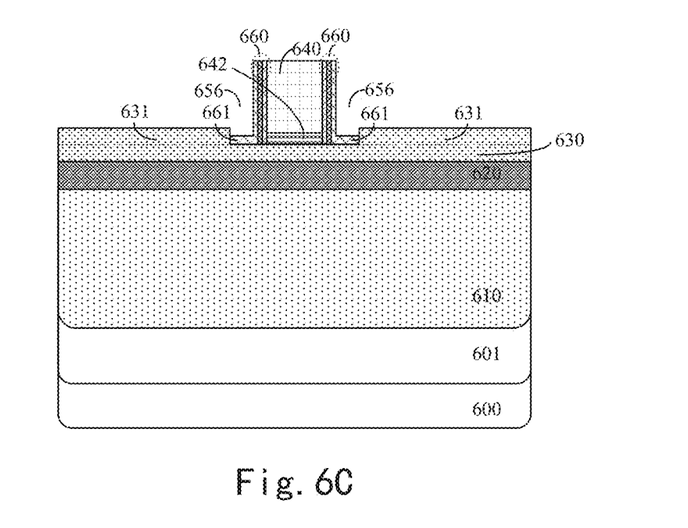

Referring to FIG. 6C, in FIG. 6C, the second spacers have been removed to form recesses 656 in regions originally corresponding to the second spacers. Since the height of the generated epitaxial silicon layer 631 is higher than the height of the extension portion 661, after the second spacers being removed, the regions corresponding to the second spacer can form the recesses 656. The recesses 656 remain the topography of the second spacers and can be symmetrically formed on both sides of the gate. After the above-described recesses 656 being formed, the select transistor gates of the SONOS memory cell can be formed in the recesses 656 in the subsequent process, and the size of the select transistor gate is directly defined.

In one embodiment, the second spacers may be removed using dry etching, wet etching, and/or other etching methods (e.g., reactive ion etching). In an embodiment, the second spacers are removed by pickling. Further, the second spacer of the SiN material may be removed by using phosphoric acid.

Figure 6D:
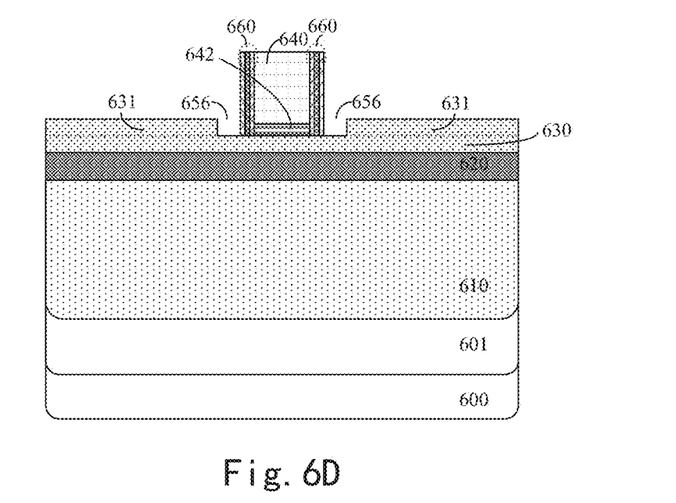

Please further refer to FIG. 6D. After removing the second spacers, as shown in FIG. 6, the method further includes removing the extensions of the first spacers 660 extending onto the surface silicon layer 630. The above extension portions are generally an insulating material, so that they can be used as a gate oxide layer between the select transistor gates and the substrate. However, since the first spacers 660 are used as protective layers in the pre-process, and hence have undergone multiple semiconductor processes. The structure of the first spacers 660 may be defective. In order to improve the reliability of the select transistors, in the present embodiment, the above extension portions may be removed, and the gate oxide layer may be grown in the subsequent order.

Further, in the above steps, the extension portions may be removed by pickling. In one embodiment, the extensions of the first spacers 660 formed above the surface silicon layer 630 can be removed by any existing or future art.

Figure 6E:
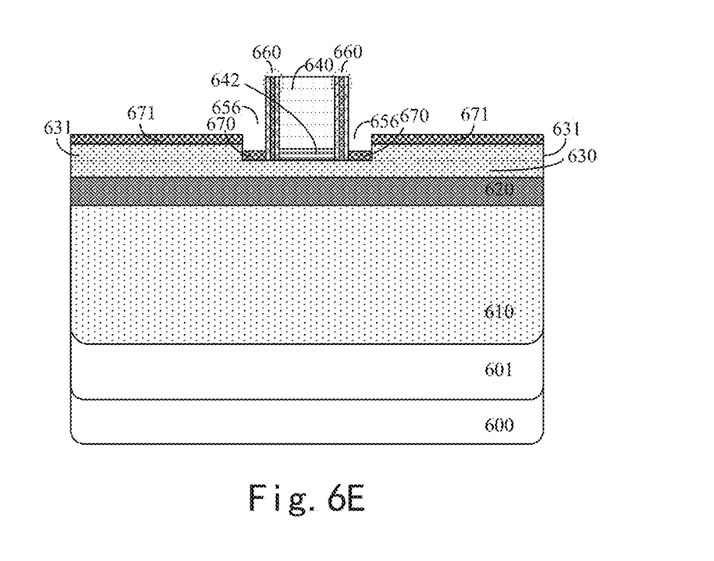

With further reference to FIG. 6E, after the extension is removed, it is also necessary to form a gate oxide layer of the select transistor in the recess 656 corresponding to the extension. As shown in FIG. 6E, the grown oxide layer may include a gate oxide layer 670 covering the portion 656, and may also include an oxide layer 671 covering the upper surface of the epitaxial silicon layer 631. In one embodiment, the above-described dense oxide layer may be formed using any existing or future arts and will not be described herein. It should be noted that the height of the gate oxide layer 670 grown above is smaller than that of the epitaxial silicon layer 631, so that the recesses 656 for forming the select transistor gates still exist among the epitaxial silicon layer 631 and the gate oxide layer 670 and the first sidewall spacers 660.

By removing the extensions of the first spacers whose structure may be defective, and then growing a dense gate oxide layer in the corresponding regions, the structure of the insulating layer between the select transistor gates and the substrate can be ensured, thereby ensuring the reliability of the work of the select transistor.

Figure 6F:
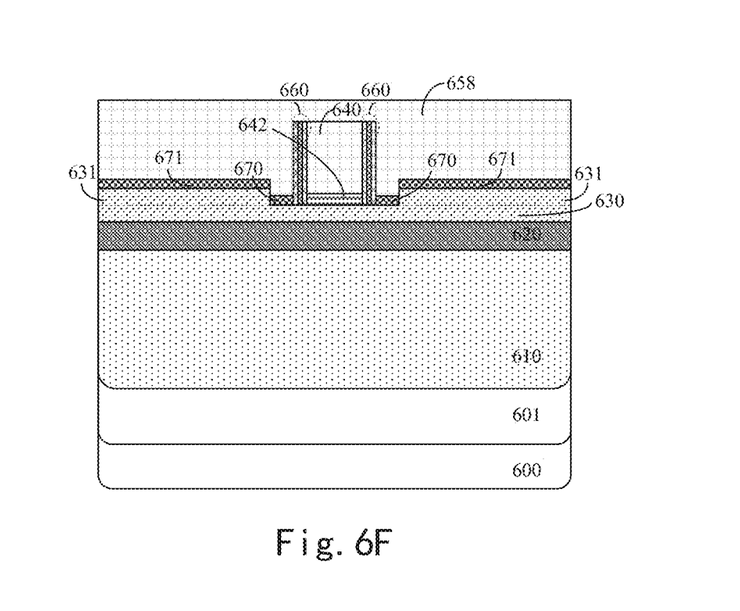

After forming the above gate oxide layer 670, please refer to FIG. 6F. In FIG. 6F, polycrystalline silicon 658 is deposited to form the select transistor gates. The above deposition process includes, but is not limited to, depositing the polycrystalline silicon 658 to form the select transistor gate by chemical vapour deposition (CVD), physical vapour deposition (PVD), atomic layer deposition (ALD), high density plasma CVD (HDPCVD), metal organic CVD (MOCVD), or plasma enhanced CVD (PECVD). The polycrystalline silicon 658 covers the epitaxial silicon layer 631, the first spacer 660 and the memory transistor gate 640.

Figure 6G:
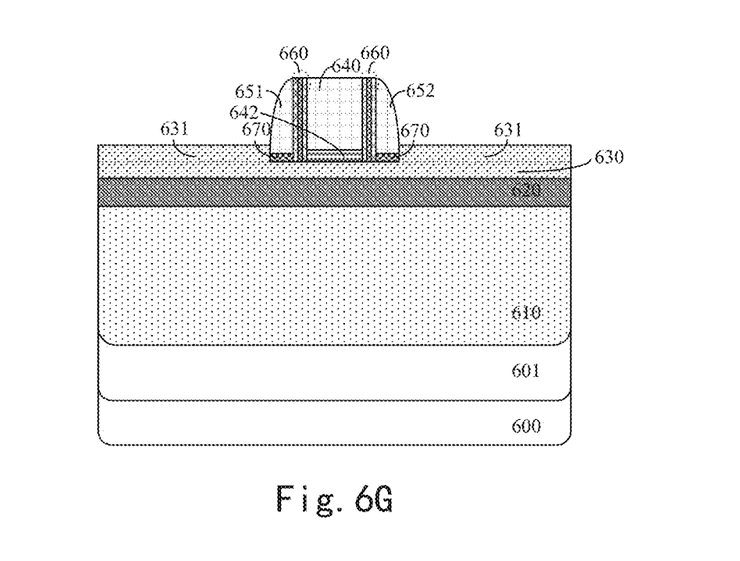

Subsequently, referring to FIG. 6G, the polycrystalline silicon 658 is etched to form a first select transistor gate 651 and a second select transistor gate 652. The etching process may include dry etching, wet etching and/or other etching manner (e.g., reactive ion etching). The etching process may also be purely chemical (plasma etching), purely physical (ion milling), and/or a combination of the foregoing. In an embodiment, the etching of the polycrystalline silicon 658 is performed by a dry etching process, and during the etching process, the oxide layer 671 formed by the pre-existing may be removed. Moreover, since the recesses has been formed by the epitaxial silicon layer in the pre-process, the recesses define the select transistor gate and gate dimensions therefore. With a dry etch process, the first select transistor gate and the second select transistor gate can be etched at a time. The first select transistor gate and the second select transistor gate remain the topography of the second spacers because of the recesses and can be symmetrically formed on both sides of the memory transistor gate. The process provided by the disclosure is simple, and at the same time, the effect of reducing the area of the memory cell can be achieved.

The embodiment of the manufacturing method provided by the present disclosure has been described to produce the SONOS structure. By modifying the existing SOI process, after silicon epitaxial growth, the silicon nitride of the second spacers can be removed by pickling, and then the polycrystalline silicon deposition and etching for the select transistor gates can be performed, and the height of the silicon epitaxial growth of the source/drain can be utilized to generate a new SONOS structure. Moreover, the definition of the channel length of the select transistor gates does not require the development of a special dry etching process. In the meantime, in this embodiment, by optimizing the gate oxide layer selection between the substrate and the select transistor gate, the operational reliability of the select transistor gate can be effectively improved, and the reliability of the SONOS memory unit is better. Without need for adding the mask, the process development is simple, and the area of the SONOS memory unit is reduced.

Therefore, the embodiments of the method for manufacturing a SONOS memory cell and the structure thereof have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A SONOS memory structure, comprising:
   a substrate and a select transistor gate and a memory transistor gate formed on the substrate, wherein
   the substrate is a composite substrate including a base silicon layer, a buried oxide layer and a surface silicon layer in order from bottom to top, wherein an upper portion of the base silicon layer has a memory transistor well region formed therein;
   the select transistor gate and the memory transistor gate are formed on the surface silicon layer;
   the select transistor gate comprises a first select transistor gate and a second select transistor gate, the first select transistor gate and the second select transistor gate are respectively located at two sides of the memory transistor gate, and are electrically isolated from the memory transistor gate by first spacers on both sides of the memory transistor gate; and
   a silicon epitaxial layer adjacent to the first select transistor gate and the second select transistor gate is formed on an upper surface of the surface silicon layer outside the first select transistor gate and the second select transistor gate.

2. The SONOS memory structure of claim 1, wherein the first select transistor gate and the second select transistor gate are symmetric about the memory transistor gate.

3. The SONOS memory structure of claim 1, wherein the upper portion of the base silicon layer has a deep well region, and the memory transistor well region is located at the upper portion of the deep well region; and
   the memory transistor well region and the base silicon layer are both of a first doping type, and the deep well region is of a second doping type different from the first doping type, wherein the first doping type is P-type, and the second doping type is N-type; or
   the first doping type is N-type, and the second doping type is P-type.

4. The SONOS memory structure of claim 1, wherein an ONO memory layer is disposed between the memory transistor gate and the surface silicon layer, a gate oxide layer is disposed between the first and second select transistor gates and the surface silicon layer.

5. The SONOS memory structure of claim 4, wherein each of the first spacers comprises an extension extending to the upper surface of the surface silicon layer, the extension being adjacent to each of the silicon epitaxial layer, the first select transistor gate and the second select transistor gate are formed over the extension, and the gate oxide layer is the extension.

6. The SONOS memory structure of claim 4, wherein the silicon epitaxial layer has a height higher than a height of the gate oxide layer.

7. The SONOS memory structure of claim 6, wherein the gate oxide layer is an oxide layer formed on the upper surface of the surface silicon layer after the extension is removed.

* * * * *